US007259464B1

United States Patent
Batra

(10) Patent No.: US 7,259,464 B1
(45) Date of Patent: Aug. 21, 2007

(54) VERTICAL TWIST SCHEME FOR HIGH-DENSITY DRAMS

(75) Inventor: Shubneesh Batra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/567,673

(22) Filed: May 9, 2000

(51) Int. Cl.
H01L 23/48 (2006.01)

(52) U.S. Cl. ............................ 257/776; 257/774

(58) Field of Classification Search ............... 365/51, 365/63, 65, 72, 149, 57; 257/663, 734–776
See application file for complete search history.

(56) References Cited

U.S. PATENT DOCUMENTS

| | | | |
|---|---|---|---|
| 4,914,502 A | 4/1990 | Lebowitz et al. | 357/68 |
| 5,010,524 A | 4/1991 | Fifield et al. | 365/205 |
| 5,026,657 A | 6/1991 | Lee et al. | 437/47 |
| 5,057,449 A | 10/1991 | Lowrey et al. | 437/60 |
| 5,087,951 A | 2/1992 | Chance et al. | 357/23.6 |
| 5,097,441 A | 3/1992 | Cho et al. | 365/51 |
| 5,107,459 A | 4/1992 | Chu et al. | 365/63 |
| 5,134,085 A | 7/1992 | Gilgen et al. | 437/52 |
| 5,214,601 A * | 5/1993 | Hidaka et al. | 365/63 |
| 5,250,457 A | 10/1993 | Dennison | 437/48 |
| 5,252,504 A | 10/1993 | Lowrey et al. | 437/34 |
| 5,262,343 A | 11/1993 | Rhodes et al. | 437/52 |
| 5,272,367 A | 12/1993 | Dennison et al. | 257/306 |
| 5,292,677 A | 3/1994 | Dennison | 437/52 |
| 5,300,814 A * | 4/1994 | Matsumoto et al. | 257/758 |
| 5,488,583 A | 1/1996 | Ong et al. | 365/201 |
| 5,534,732 A | 7/1996 | DeBrosse et al. | 257/776 |
| 5,585,285 A | 12/1996 | Tang | 437/21 |
| 5,605,857 A | 2/1997 | Jost et al. | 437/60 |
| 5,864,181 A | 1/1999 | Keeth | 257/776 |
| 6,043,562 A | 3/2000 | Keeth | 257/776 |

OTHER PUBLICATIONS

"*A Novel Architecture For Advanced High Density Dynamic Random Access Memories.*" Thesis by Brent Keeth, May 1996.
"*A Twisted Bit Line Technique for Multi–Mb DRAMs*" by Yoshihara et al, 1998 IEEE International Solid–State Circuits Conference Digest of Technical Papers, pp. 3–4.

(Continued)

Primary Examiner—Leonardo Andujar
(74) Attorney, Agent, or Firm—Wong Cabello Lutsch Rutherford & Brucculeri, LLP

(57) ABSTRACT

An interconnection array subunit and method for forming the interconnection array subunit are provided, the interconnection array subunit including a first pair of line conductors in first and second regions, the first pair of line conductors including a first true line conductor and a first associated complementary line conductor connected and vertically twisted in a vertical twisting region between the first and second regions. The interconnection array subunit also includes a second pair of line conductors adjacent to the first pair of line conductors in the first and second regions, the second pair of line conductors including a second true line conductor and a second associated complementary line conductor. The interconnection array subunit also includes a first interconnection layer disposed in the vertical twisting region, the first interconnection layer connecting the second associated complementary line conductor in the first region to the second associated complementary line conductor in the second region. The interconnection array subunit also includes a second interconnection layer disposed in the vertical twisting region, the second interconnection layer connecting the second true line conductor in the first region to the second true line conductor in the second region. The first true line conductor is disposed below the first associated complementary line conductor in the first region and above the first associated complementary line conductor in the second region. The second true line conductor is disposed below the second associated complementary line conductor in the first and second regions.

30 Claims, 7 Drawing Sheets

OTHER PUBLICATIONS

"*A 33nd 64 Mb DRAM*," by Oowaki et al., 1991 IEEE.
"A Novel Architecture for Advanced High Density Dynamic Random Access Memories," Thesis by Brent Keeth, May 1996.

"A Twisted Bit Line Technique for Multi-Mb DRAMs," by Yoshihara et al., 1998 IEEE Int'l Solid-State Circuits Conference Digest of Technical Papers, pp. 3-4.
"A 33ns 64 Mb DRAM," by Oowaki et al., 1991 IEEE.

* cited by examiner

VERTICAL TWIST SCHEME FOR HIGH-DENSITY DRAMS

FIELD OF THE INVENTION

This invention relates generally to a semiconductor memory array and semiconductor integrated circuits, and, more particularly to a scheme for arranging line conductors and interconnection lines in such a semiconductor memory array and in semiconductor integrated circuits.

BACKGROUND OF THE INVENTION

Semiconductor integrated circuits (ICs) typically are formed by metal-oxide semiconductor (MOS) or bipolar transistors that are integrated at a planar major surface of a silicon chip. Electrical interconnections between various transistors, and between certain transistors and input/output pads, have taken the form of electrically connecting lines that comprise a layer of metallization running along an essentially planar surface. In some ICs, two or more "levels" of interconnections may be required. The planar surfaces of the interconnections are oriented mutually parallel to, and are insulated from, both each other and the top planar surface of the chip by suitable insulating layers. Connections to the transistors at lower levels than the metallization layers are provided through openings called contacts, and connections between different interconnection layers are provided through insulation openings called vias.

In memory ICs, such as random access memories (RAMs), the data in the memory array are accessed by an external data path by means of a number of electrically conducting lines. The electrically conducting lines in the array are conventionally arranged in the form of an array of parallel metallization strips. For example, a dynamic RAM (DRAM) contains an array of hundreds of parallel bit lines, or digit lines. A DRAM also contains an array of parallel word lines. The word lines, typically lie at a different planar level than the bit lines. The array of bit lines and the array of word lines lie perpendicular to each other, forming a grid. Memory cells in the DRAM lie at an intersection of a bit line and a word line.

The bit lines, or digit lines, in a DRAM can give rise to electrical cross-coupling or "cross-talk." For example, access to any given bit line or digit line may spuriously influence memory cells connected to adjacent bit lines or digit lines. The term "pattern sensitivity" is applied to this undesirable phenomenon. The problems of cross-talk and pattern sensitivity can arise in other interconnection arrays, such as address busses and data busses where similarly paired, parallelly disposed line conductors are employed. In these environments, cross-talk and pattern sensitivity can result in undesirable errors.

Memory ICs such as DRAMs typically have a memory array of millions of memory cells that store electrical charges indicative of binary data. For instance, the presence of an electrical charge in the memory cell usually equates to a binary "1" value, and the absence of an electrical charge usually equates to a binary "0" value. The memory cells are accessed via address signals on row and column lines. Once accessed, data is written to, or read from, the addressed memory cell via bit lines, or digit lines.

One common design found in many memory circuit topologies or configurations or layouts is the "folded bit line" or "folded digit line" structure or architecture, also known as the $8F^2$ architecture. In a folded bit line construction, the bit lines are arranged in pairs with each pair being assigned to complementary binary signals. For example, one bit line (the "true" line) in the pair is dedicated to a binary signal DATA while the other bit line (the "associated complementary" line) in the pair is dedicated to handle the associated complementary binary signal DATA*. (The asterisk notation "*" is used throughout to indicate the binary complement.)

The memory cells are connected to one of the bit lines in the folded pair. During read it and write operations, the bit lines are driven to opposing voltage levels depending on the data content being written to or read from the memory cell. For purposes of explanation, the following example describes a read operation of a memory cell holding a charge indicative of a binary "1" value. The voltage potential of both bit lines in the pair are first preferably equalized to a middle voltage level such as 1.2V for a memory circuit with a supply voltage level of 2.5V. Then, the addressed memory cell is accessed and the charge held therein begins to flow to one of the bit lines in the bit line pair, causing the voltage of that bit line to be raised slightly above the voltage of the other bit line of the pair. A sense amplifier, or similar circuit, senses the voltage differential on the bit line pair and further increases this differential by increasing the voltage on the first bit line to 2.5V and decreasing the voltage on the second bit line to 0V. The folded bit lines thereby output the data in a complementary form, which is transmitted to the output pads.

One version of a folded bit line architecture or structure is the twisted bit line structure. FIG. 1 illustrates a conventional twisted bit line structure having bit line pairs D0/D0* through D3/D3*. Twisting occurs at twist junctions 120 across the array of bit lines when the true line in a bit line pair (D0 for example) exchanges positions with the associated complementary line (D0*) in the pair. Memory cells are coupled to the bit line pairs throughout the array. Representative memory cells 122a through 122n and 124a through 124n are shown coupled to bit line pair D0/D0*. The twisted bit line structure evolved as a technique to reduce bit line interference noise or cross-talk or pattern sensitivity during chip operation. Such noise becomes more problematic as memory density increases. The twisted bit line structure is therefore used in larger, higher density, memories such as a 64 Mb DRAM.

Conventional twisted bit line architectures have a number of disadvantages as compared to open bit line architectures. One disadvantage is the relatively large amount of chip "real estate" that is typically used by the twist junctions 120. Yet another disadvantage is that the use of the conventional twisted folded bit line architecture may result in an inefficient use of the cell matrix space. The conventional twisted bit line architecture does not use space efficiently because it provides a lower packing density of memory cells than the open bit line architecture, and because it cannot utilize a cross-point layout cell structure. Some of these disadvantages could be overcome if a cross-point layout were combined with a folded bit line architecture. This combination would offer both high packing density and good noise immunity. Implementing this combination would require that the bit lines be vertically twisted, not just horizontally twisted as shown in FIG. 1.

One attempt in the prior art to provide a DRAM architecture that utilizes the advantages ie of both a cross-point layout cell architecture and a folded bit line architecture is described in U.S. Pat. No. 5,107,459 to Chu et al. Chu utilizes a three-dimensional approach by stacking the two lines in a bit line pair (the true bit line and the complementary bit line) vertically one above the other in two layers of metallization. The two layers are twisted by means of a third layer.

A scheme similar to the scheme described by Chu is shown conceptually and schematically in FIG. 2. In the scheme in FIG. 2, bit line pairs ($D_1$, $D_1$*) and ($D_2$, $D_2$*) form a sub-array 200. Bit line pair ($D_1$, $D_1$*) consists of bit lines $D_{1L}$ and $D_{1L}$* to the left of the twisting region 210, and bit lines $D_{1R}$ and $D_{1R}$* to the right of the twisting region 210. Similarly, bit line pair ($D_2$, $D_2$*) consists of bit-lines $D_{2L}$ and $D_{2L}$* to the left of the twisting region 210, and bit lines $D_{2R}$ and $D_{2R}$* to the right of the twisting region 210. The thick-strips in FIG. 2 represent a first layer of metallization, and the thin solid lines represent a second layer of metallization arranged above, and insulated from, the first layer of metallization. The alternating dashed-dotted lines in FIG. 2 represent a third interconnection layer, a polysilicon layer, arranged below and insulated from the first layer of metallization. The twisting region 210 is situated between two dummy word lines 220 formed in the polysilicon layer. The two dummy word lines 220 are situated adjacent to real word lines (not shown).

In the scheme shown in FIG. 2, the two bit lines (the true bit line and the complementary bit line) in a bit line pair, which are stacked vertically one above the other, exchange vertical positions as they cross the twisting region 210. In other words, the bit lines are vertically twisted within the twisting region 210. For example, the portion of the true bit line $D_2$ on the left of the twisting region 210 ($D_{2L}$) is formed in the first (lower) layer of metallization, while the portion of $D_2$ on the right of the twisting region 210 ($D_{2R}$) is formed in the second (upper) layer of metallization. Likewise, the portion of the complementary bit line $D_2$* on the left of the twisting region 210 ($D_{2L}$*) is formed in the second (upper) layer of metallization, while the portion of $D_2$* on the right of the twisting region 210 ($D_{2R}$*) is formed in the first (lower) layer of metallization. Thus $D_2$ and $D_2$* exchange vertical positions as they cross the twisting region 210. As shown in FIG. 2, the vertical twisting of bit line pair ($D_2$, $D_2$*) is effected within the twisting region 210 by having the bit line $D_{2L}$ veer to its left (upwards in FIG. 2), and connecting $D_{2L}$ to $D_{2R}$ through a via 230. The vertical twisting of bit line pair ($D_2$, $D_2$*) is further effected within the twisting region 210 by having the bit line $D_{2R}$* veer to its left (downwards in FIG. 2), and connecting $D_{2R}$* to the bit line $D_{2L}$* through a via 240.

Vertical twisting of the other bit line pair ($D_1$, $D_1$*) in sub-array 200 is accomplished in a different manner. The portion of the true bit line $D_1$ on the left of the twisting region 210 ($D_{1L}$) is formed in the first (lower) layer of metallization, while the portion of $D_1$ on the right of the twisting region 210 ($D_{1R}$) is formed in the second (upper) layer of metallization. Likewise, the portion of the complementary bit line $D_1$* on the left of the twisting region 210 ($D_{1L}$*) is formed in the second (upper) layer of metallization, while the portion of $D_1$* on the right of the twisting region 210 ($D_{1R}$*) is formed in the first (lower) layer of metallization. As shown in FIG. 2, the vertical twisting of bit line pair ($D_1$, $D_1$*) is effected within the twisting region 210 by having the bit line $D_{1L}$ connect to a polysilicon layer interconnection 250 through a contact hole 255. The polysilicon layer interconnection 250 extends across the twisting region 210, passes underneath bit lines $D_{2L}$ and $D_{2R}$*, and connects to an interlayer interconnection 260 through a contact hole 265. The interlayer interconnection 260, which is formed in the first metallization layer, connects in turn to the bit line $D_{1R}$ through a via 270. The vertical twisting of bit line pair ($D_1$, $D_1$*) is further effected within the twisting region 210 by having the bit line $D_{1R}$* connect to a polysilicon layer interconnection 275 through a contact hole 280. The polysilicon layer interconnection 275 extends across the twisting region 210, passes underneath the bit lines $D_{2R}$* and $D_{2L}$, and connects to an interlayer interconnection 285 through a contact hole 290. The interlayer interconnection 285, which is formed in the first metallization layer, connects in turn to the bit line $D_{1L}$* through a via 295.

The vertical twisting scheme represented in FIG. 2 has a number of shortcomings. One shortcoming is that the bit line pairs within each sub-array exchange horizontal positions as they cross the twisting region 210. In other words, the bit lines are twisted horizontally as well as vertically. For example, bit line pairs ($D_1$, $D_1$*) and ($D_2$, $D_2$*) in FIG. 2 exchange horizontal positions (upper and lower positions in the figure) within sub-array 200 as they cross the twisting region 210. This exchange of horizontal positions tends to complicate the layout of the memory array. Another shortcoming of the scheme in FIG. 2 is that the scheme requires the use of two sets of polysilicon layer interconnections to effect the vertical twisting of the odd-numbered bit line pairs, ($D_{2j+1}$, $D_{2j+1}$*) (with j=0, 1, 2, 3) in each sub-array. For example, in FIG. 2 two polysilicon layer interconnections (250 and 275) are used to effect the vertical twisting of the odd-numbered bit line pair ($D_1$, $D_1$*) in sub-array 200. A third shortcoming of the vertical twisting scheme in FIG. 2 is that the scheme requires three layers to achieve the twist. This added complexity takes up more space (being both wide and long due to additional metal pads) and does not allow three twists. Further, the vertical twisting scheme of FIG. 2 requires the deposition of additional layers beyond the layers deposited in the standard DRAM fabrication process. A final shortcoming of the scheme in FIG. 2 is that the scheme does not allow vertical twisting of only one of the bit line pairs of each sub-array. A twisting scheme without this shortcoming would provide more design flexibility. For example, the ability to effect vertical twisting of only one of the bit line pairs would allow the twisting of each of the bit line pairs in a sub-array 200 to occur at different locations, as shown in FIG. 1 (where bit line pair (D0, D0*) is twisted at a different location 120 than bit line pair (D1, D1*)). Staggering the locations at which adjacent bit line pairs are twisted provides superior noise reduction.

The present invention is directed to overcoming, or at least reducing the effects of, one or more of the perceived shortcomings of prior art twisting schemes. Furthermore, the present invention advantageously occupies less chip "real estate" than the vertical twisting scheme represented in FIG. 2.

SUMMARY OF THE INVENTION

In accordance with one aspect of the present invention, an interconnection array subunit and method for forming the interconnection array subunit are provided, the interconnection array subunit including a first pair of line conductors in first and second regions, the first pair of line conductors including a first true line conductor and a first associated complementary line conductor connected and vertically twisted in a vertical twisting region between the first and second regions. The interconnection array subunit also includes a second pair of line conductors adjacent to the first pair of line conductors in the first and second regions, the second pair of line conductors including a second true line conductor and a second associated complementary line conductor. The interconnection array subunit also includes a first interconnection layer disposed in the vertical twisting region, the first interconnection layer connecting the second associated complementary line conductor in the first region to the second associated complementary line conductor in the second region. The interconnection array subunit also includes a second interconnection layer disposed in the vertical twisting region, the second interconnection layer connecting the second true line conductor in the first region to the second true line conductor in the second region. The two interconnection layers do so by bypassing beneath the adjacent twist region. The first true line conductor is disposed below the first associated complementary line conductor in the first region and above the first associated complementary line conductor in the second region. The second true line conductor is disposed below the second associated complementary line conductor in the first and second regions.

In accordance with another aspect of the instant invention, a method is provided for laying out line conductors for such an interconnection array subunit.

BRIEF DESCRIPTION OF THE DRAWINGS

Other objects and advantages of the invention will become apparent upon reading the following detailed description of a specific embodiment of the invention, and upon reference to the accompanying drawings, in which.

Figure 1:
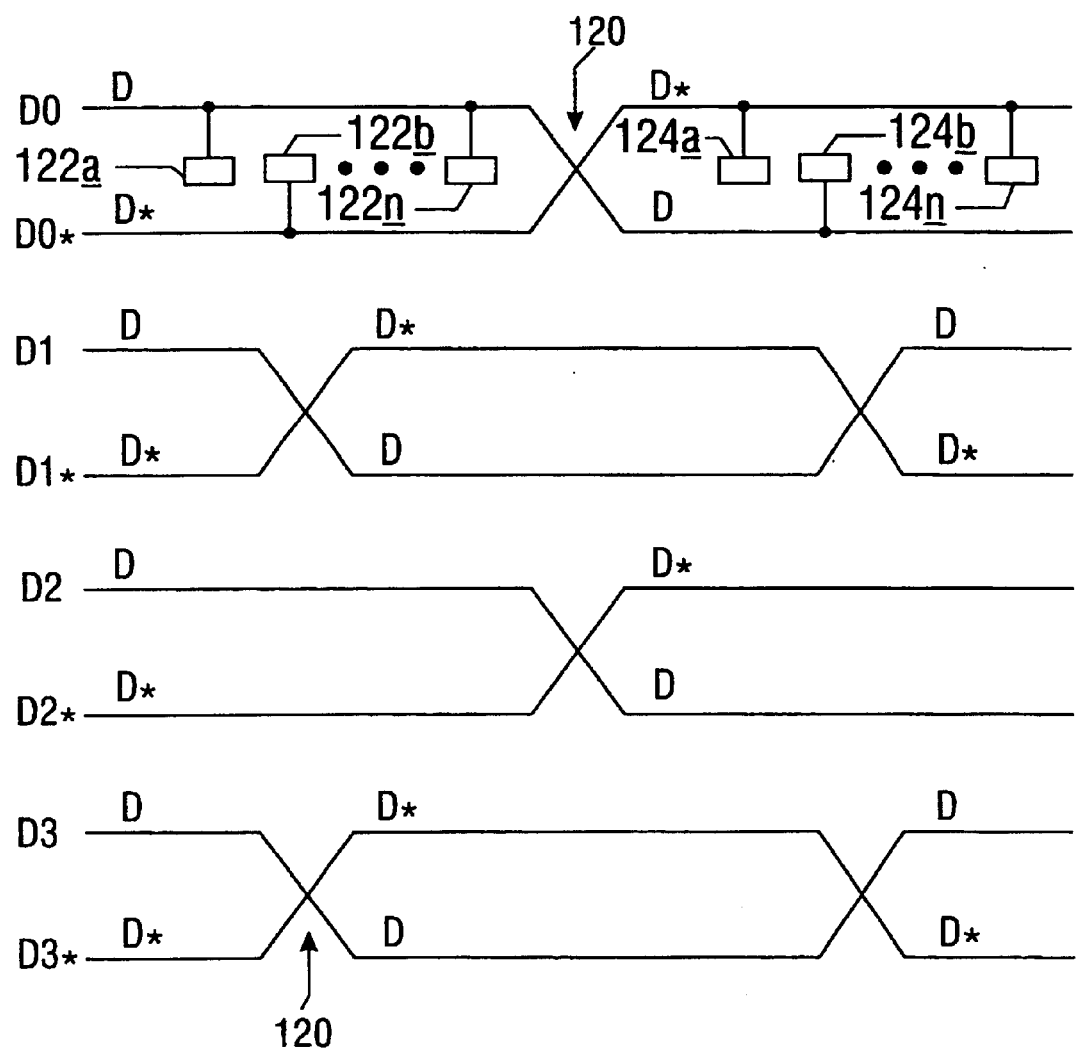
FIG. 1 is a diagrammatic circuit topology having a conventional folded and twisted bit line structure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF A SPECIFIC EMBODIMENT OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, that will vary from one implementation to another. Moreover, it will be appreciated that such a development effort, even if complex and time-consuming, would be a routine undertaking for those of ordinary skill in the art having the benefit of this disclosure.

Figure 3:
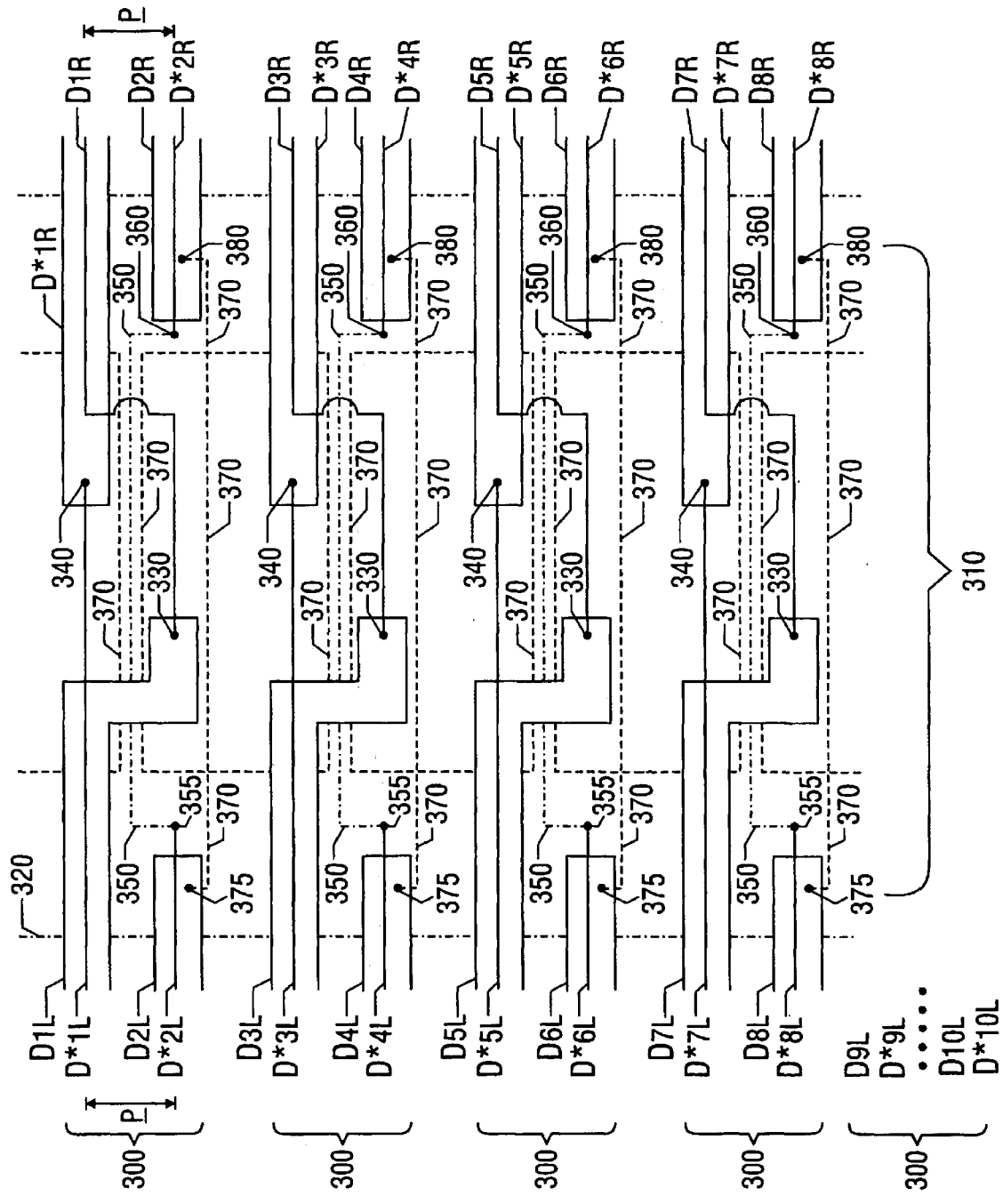
FIG. 3 is a schematic diagram of a stacked digit line architecture according to an embodiment of the present invention.

Turning now to the drawings, and in particular to FIG. 3, an interconnection array is shown conceptually and schematically for one particular embodiment of the invention. The interconnection array consists of a series of adjacent interconnection array subunits 300. Each interconnection array subunit 300 comprises two adjacent bit line pairs, which are also known as digit line pairs. For example, the topmost interconnection array subunit 300 in FIG. 3 comprises digit line pairs $(D_1, D_1^*)$ and $(D_2, D_2^*)$. The interconnection array in FIG. 3 comprises a total of ten digit line pairs, $(D_i, D_i^*)$ (with i=1, 2, ... 10), in five interconnection array subunits 300. Each interconnection array subunit 300 includes two consecutively numbered digit bit line pairs. One of the consecutively numbered pairs is an odd-numbered digit line pair, $(D_{2j+1R}, D_{2j+1R}^*)$ (j=0=0, 1, 2, 3, 4), and the other pair is an even-numbered digit bit line pair, $(D_{2k}, D_{2k}^*)$ (k=1, 2, 3, 4, 5).

The interconnection array also contains a vertical twisting region 310, which is situated between two dummy word lines 320. The interconnection array can be considered to consist of three regions: the region to the left of the twisting region 310, the twisting region 310, and the region to the right of the twisting region 310. The portions of the digit lines in each digit line pair, $(D_i, D_i^*)$ (with i=1, 2, ... 8), in the region to the left of the twisting region 310 are designated $D_{iL}$ and $D_{iL}^*$, while the portions of the digit lines in the region to the right of the twisting region 310 are designated $D_{iR}$ and $D_{iR}^*$. The digit lines within each digit line pair are separated by a digit line pitch P.

Figure 5:
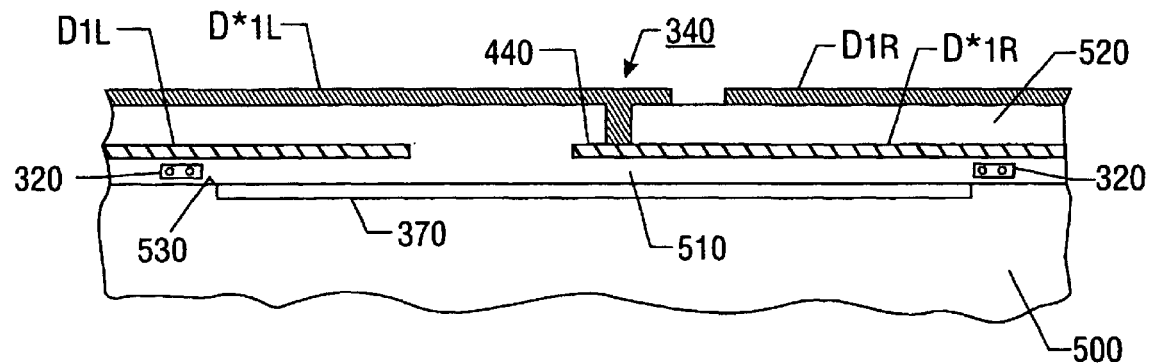
FIG. 5 is a cross-sectional view of the view of FIG. 4 taken along the line V—V.

In the embodiment in FIG. 3, the digit lines $D_{iL}$ are interconnections formed in a buried layer of polycide, while the digit lines $D_{iL}^*$ are interconnections formed in a layer of metallization. As best seen in FIG. 5, the digit lines formed in a layer of metallization are arranged above, and insulated from, the digit lines formed in a buried layer of polycide. In FIG. 3, digit lines formed in a buried layer of polycide, such as $D_{iL}$, are represented as thick strips, whereas digit lines formed in a layer of metallization, such as $D_{1L}^*$, are represented as thin solid lines.

Figure 6:
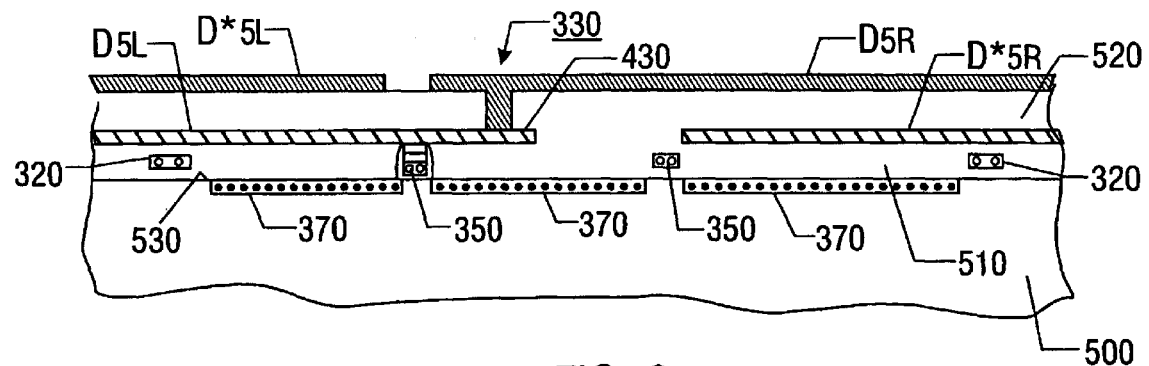
FIG. 6 is a cross-sectional view of the view of FIG. 4 taken along the line VI—VI.
Figure 7:
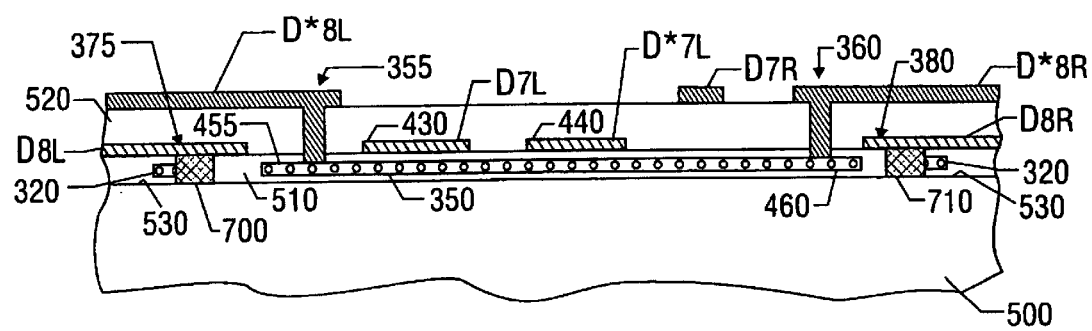
FIG. 7 is a cross-sectional view of the view of FIG. 4 taken along the line VII—VII.

The alternating dashed-dotted lines of FIG. 3 represent interconnections, such as interconnection 350, are formed in a polysilicon layer. As best shown in FIGS. 6 and 7, interconnections formed in the polysilicon layer are arranged below, and insulated from, the buried layer of polycide ($D_{5L}$ and $D_{5R}^*$ in FIG. 6, and $D_{8L}$ and $D_{8R}$ in FIG. 7). The dotted lines in FIG. 3 represent interconnections, such as interconnection 370, that are formed in an active area layer. As best shown in FIGS. 5 and 6, interconnections formed in an active area layer, such as interconnection 370, are diffused into an underlying substrate, such as substrate 500. As also shown in FIG. 6, an active area layer, such as interconnection 370, may be arranged so it does not lie beneath the interconnections formed in the polysilicon layer, such as interconnection 350. In this arrangement, the polysilicon interconnection 350 does not overlap the active area layer interconnection 370. Alternatively, active area layer interconnections may be arranged below, and insulated from, interconnections formed in the polysilicon layer. The active area layer may also be arranged beneath, and insulated from, the buried layer of polycide. For example, in FIG. 5 the active area layer 370 is beneath, and insulated from, buried polycide layers $D_{1L}$ and $D_{1R}^*$.

In the interconnection array shown in FIG. 3, only the odd-numbered digit lines pairs are vertically twisted within the vertical twisting region 310. This is similar to the portion of the is array in the left-most third of FIG. 1, where only odd bit line pairs (D1, D1*) and D3, D3*) are twisted. In the region to the left of the vertical twisting region 310 all true digit lines, including the true odd digit lines $D_{2j+1L}$ (j=0, 1, 2, 3, 4), are formed in the buried layer of polycide. In this same region, all of the associated complementary odd digit lines, including the associated complementary odd digit lines $D_{2j+1L}*$ (j=0, 1, 2, 3, 4), are formed in the layer of metallization. In the region to the right of the vertical twisting region 310, after vertical twisting, the true odd digit lines $D_{2j+1R}$ (j=0, 1, 2, 3, 4) are formed in the layer of metallization and the associated complementary odd digit lines $D_{2j+1R}*$ (j=0, 1, 2, 3, 4) are formed in the buried layer of polycide. Thus both the true odd digit lines and the associated complementary odd digit lines have been vertically twisted in the vertical twisting region 310.

The vertical twisting of the odd digit line pairs ($D_{2j+1}$, $D_{2j+1}*$) (j=0, 1, 2, 3, 4) is effected in the vertical twisting region 310 by having the true odd digit lines, $D_{2j+1L}$ (j=0, 1, 2, 3, 4), connect to their respective true odd digit lines to the right of the twisting region 310, $D_{2j+1R}$ (j=0, 1, 2, 3, 4), through contact holes 330 and 340. As shown in FIG. 6, the contact hole 330 connects a buried polycide true odd digit line in the region to the left of the twisting region 310 ($D_{5L}$ in FIG. 6) to a metallization true odd digit line in the region to the right of the twisting region 310 ($D_{5R}$ in FIG. 6).

The vertical twisting of the odd digit line pairs is further effected by having the associated complementary digit lines in the region to the left of the twisting region 310, $D_{2j+1L}*$ (j=0, 1, 2, 3, 4), connect to their respective associated complementary digit lines in the region to the right of the twisting region, $D_{2j+1R}*$ (j=0, 1, 2, 3, 4). This connection takes place through contact holes 340, as shown in FIGS. 3 and 5.

In contrast to the odd-numbered digit lines pairs, the even-numbered digit line pairs ($D_{2k}$, $D_{2k}*$)(k=1, 2, 3, 4) are not vertically twisted within the vertical twisting region 310. As shown in FIG. 3, in the region to the left of the vertical twisting region 310 the true even digit lines $D_{2kL}$ (k=1, 2, 3, 4) are formed in the buried layer of polycide, and the associated complementary digit lines $D_{2kL}*$ (k=1, 2, 3, 4) are formed in the layer of metallization. In the region to the right of the vertical twisting region 310, true even digit lines $D_{2kR}$ (k=1, 2, 3, 4) are formed in the buried layer of polycide, and the associated complementary digit lines $D_{2kR}*$ (k=1, 2, 3, 4) are formed in the layer of metallization.

As shown in FIGS. 3 and 7, interconnection of the even digit line pairs ($D_{2k}$, $D_{2k}*$) (k=1, 2, 3, 4) across the vertical twisting region 310 is effected, without vertical twisting, by having the associated complementary digit lines $D_{2kL}*$ (k=1, 2, 3, 4) connect to interconnections 350 in the polysilicon layer through contact holes 355. The interconnections 350 in the polysilicon layer extend across the vertical twisting region 310, pass underneath the true odd digit lines $D_{2j+1L}$ and $D_{2j+1R}$ (j=0, 1, 2, 3), and connect to respective associated complementary digit lines $D_{2kR}*$ (k=1, 2, 3, 4) through contact holes 360.

Figure 8:
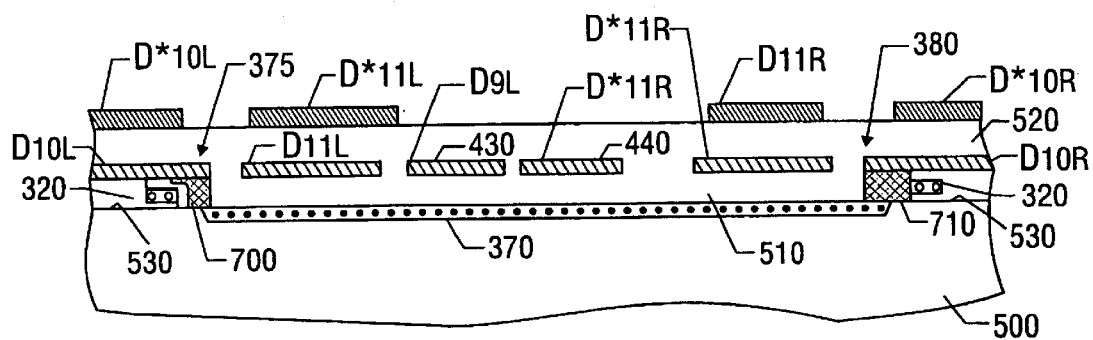
FIG. 8 is a cross-sectional view of the view of FIG. 4 taken along the line VIII—VIII.

As shown in FIGS. 3 and 8, the interconnection of the even digit line pairs across the vertical twisting region 310 is further effected, without vertical twisting, by having the true even digit lines $D_{2kL}$ (k=1, 2, 3, 4) connect to interconnections 370 in the active layer through a buried contact or plug contact 375. The active area interconnection 370 also contacts the material 700 within the contact hole 375. As shown in FIG. 8, the active area interconnection 370 extends from the contact 375 across the vertical twisting region 310, passing underneath all other interconnection layers, and connects to a true even digit lines ($D_{10R}$ in FIG. 8) through a contact 380. As previously discussed, the contact between the true even digit line ($D_{10R}$) and the material 710 in the contact hole 380 may be in the form of a plug contact.

In the interconnection array in FIG. 3, the odd digit line pairs ($D_{2j+1}$, $D_{2j+1}*$) (j=0, 1, 2, 3) are vertically twisted, while the even digit line pairs ($D_{2k}$, $D_{2k}*$)(k=1, 2, 3, 4) are not twisted. In other interconnection arrays in the same memory array, the even digit lines pairs may be vertically twisted, while the odd digit line pairs are not twisted. By twisting the even digit line pairs and the odd digit line pairs in adjacent interconnection arrays, the location of the twisting regions 310 for even and odd digit line pairs can be staggered. FIG. 1 shows a similar staggering of the twisting regions 120 for odd and even digit line pairs. The twisting regions for the even and odd digit line pairs must be staggered in order to provide effective noise cancellation.

Figure 2:
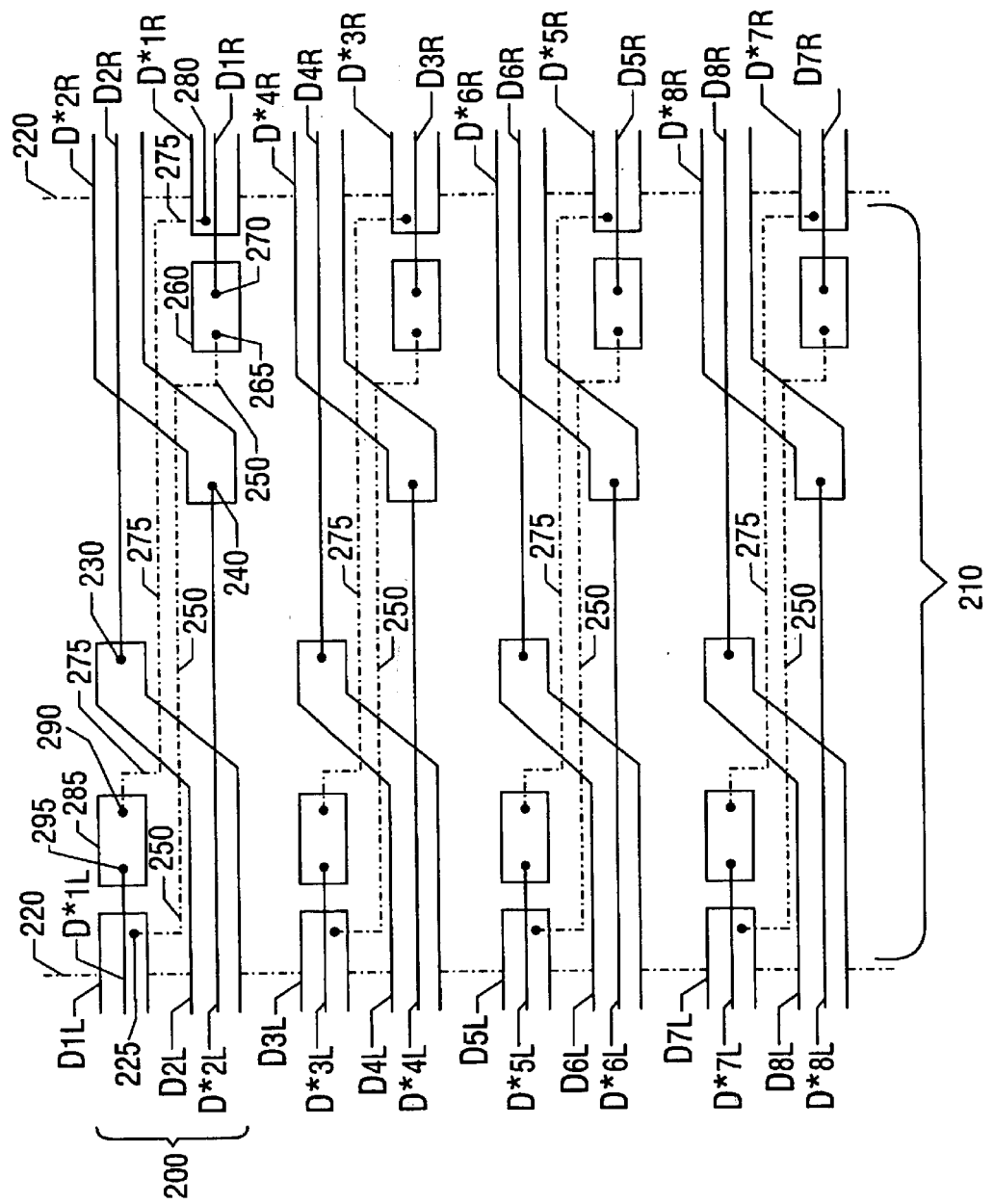
FIG. 2 is a schematic diagram of a conventional stacked bit line architecture.

The vertical twisting scheme implemented in the interconnection array in FIG. 3 has a number of advantages over the conventional vertical twisting scheme shown in FIG. 2. The scheme in FIG. 3 employs only a single polysilicon interconnection layer and an active region 350, which is deposited as a matter of course in the standard DRAM fabrication process. The conventional vertical twisting scheme in FIG. 2 requires the deposition of a second polysilicon interconnection layer that is not deposited in the standard DRAM fabrication process. Furthermore, the scheme in FIG. 3 vertically twists the odd digit line pairs, ($D_{2j+1}$, $D_{2j+1}*$) (j=0, 1, 2, 3) without vertically twisting the even digit line pairs ($D_{2k}$, $D_{2k}*$) (k=1, 2, 3, 4). The scheme in FIG. 3 does not transpose the horizontal locations of the digit line pairs within an interconnection array subunit 300, such as the subunit containing digit line pairs ($D_1$, $D_1*$) and ($D_2$, $D_2*$). Conversely, the vertical twist scheme in FIG. 2 transposes the horizontal location of the bit lines in the bit line pair in each sub-array 200, such as the sub-array containing bit line pairs ($D_1$, $D_1*$) and ($D_2$, $D_2*$). Also, the vertical twist scheme of FIG. 3 does not require pads 260 and 290.

Figure 4A:
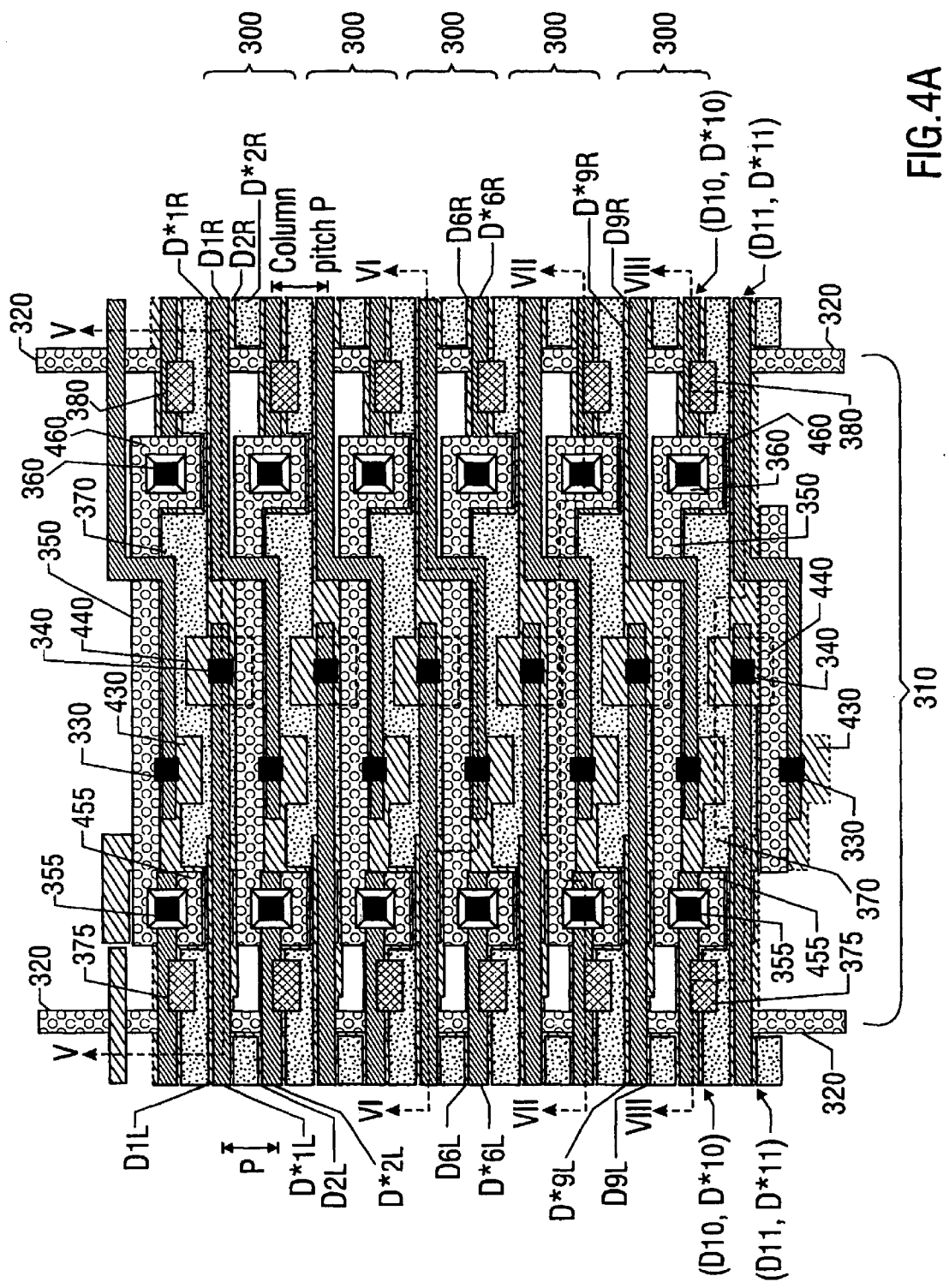
FIG. 4 is a digit line layout view of a vertical twisting region according to the embodiment shown in FIG. 3.
Figure 4B:
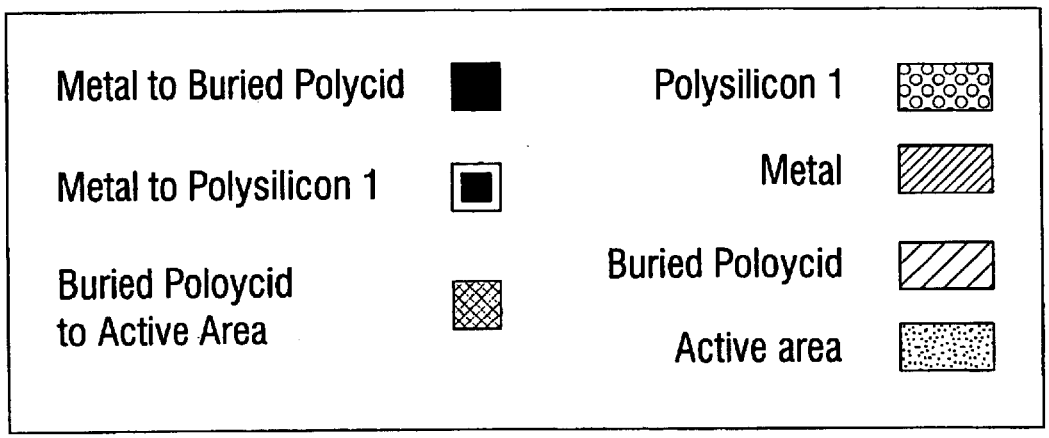

FIG. 4 illustrates how the embodiment shown schematically in FIG. 3 may be physically laid out on an IC. The view of the interconnection array in FIG. 4 shows eleven digit line pairs, ($D_i$, $D_i*$) (i=1, 2, . . . 11), and five interconnection array subunits 300. The portions of the digit lines in the region to the left of the vertical twisting region 310 are designated $D_{iL}$ and $D_{iL}*$, and the portions of the digit lines in the region to the right of the vertical twisting region 310 are designated $D_{iR}$ and $D_{iR}*$. The separation between the digit lines in each digit line pair is the digit line pitch P.

In FIG. 4, each of the interconnection layers in the interconnection array is represented by a different pattern. Interconnections formed in the buried layer of polycide, which are represented by the thick strips in FIG. 3, are represented in FIG. 4 by thick strips containing sparse diagonal hatching. Interconnections formed in the layer of metallization, which were represented by solid lines in FIG. 3, are represented by the thinner strips with denser hatching in FIG. 4. Interconnections formed in the polysilicon layer, which are represented by alternating dashed-dotted lines in FIG. 3, are represented by strips filled with circles in FIG. 4. Finally, interconnections formed in the active area layer, which are represented by dotted lines in FIG. 3, are represented in FIG. 4 by strips containing dots.

FIG. 4 also shows the physical layout of the contacts in the interconnection array. The contacts that provide a pathway from a metallization interconnection layer down to a buried polycide interconnection layer are represented by solid black squares. This type of contact provides pathways between true odd digit lines on the left of the twisting region 310 $D_{2j+1L}$ (j=0, 1, 2, 3, 4, 5), which are formed in buried polycide, to their respective true odd digit lines on the right of the twisting region 310 $D_{2j+1R}$ (j=0, 1, 2, 3, 4, 5), which are formed in the metallization layer. This type of contact also provides pathways between associated complementary odd digit lines on the left of the twisting region 310 $D_{2j+1L}*$ (j=0, 1, 2, 3, 4, 5), which are formed in the metallization layer, to their respective associated complementary odd digit lines on the right of the twisting region 310 $D_{2j+1R}*$ (j=0, 1, 2, 3, 4, 5), which are formed in the buried polycide layer.

In the physical layout shown in FIG. 4, the contacts drop down onto an enlarged portion of the buried polycide. This enlarged portion is referred to as a surround. So FIG. 4 shows contact holes 330 and 340 contacting surrounds 430 and 440 respectively. The enlarged size of the surrounds helps ensure the contact holes (330,340) will contact the buried polycide layer (430,440), even if there is a slight misalignment of the masks defining the location of the buried polycide interconnection layer and the mask defining the location of the contact hole (330,340).

FIG. 4 also shows the contacts that provide a pathway between an interconnection formed in the metallization layer and an interconnection formed in the polysilicon. These contacts are represented by solid black squares crossed by the diagonals of larger circumscribing squares. The larger circumscribing square is only intended to differentiate between a contact between metallization and polysilicon layers from a contact between metallization and buried polycide layers. The circumscribing square does not imply that contacts between via between metallization and polysilicon layer must be larger in size. As shown in FIGS. 3, 4, and 7, contacts 355 between metallization and polysilicon layers connect the associated complementary even digit lines to the left of the twisting region 310 $D_{2kL}*$ (k=1, 2, 3, 4, 5) to the polysilicon interconnection 350. The contact 355 contacts the polysilicon layer with surround 455. Similarly, FIGS. 3, 4, and 7 show that contacts 360 between metallization and polysilicon layers connect the even associated complementary digit lines $D_{2kR}*$ (k=1, 2, 3, 4, 5) to polysilicon interconnection layer 350. A surround 460 is included in the polysilicon interconnection layer 350.

FIG. 4 also shows the contacts that provide a pathway between an interconnection formed in the buried polycide layer and an interconnection formed in the active area. The contacts are represented by cross-hatched rectangles. The digit line is shown as partially covering the contact in this embodiment, but the layout could be altered such that the digit line completely covers the contact. In the layout shown in FIG. 4, the contacts (375, 380) provide a pathway between true even digit lines, $D_{2kL}$ (k=1, 2, 3, 4, 5) and $D_{2kR}$ (k=1, 2, 3, 4, 5) respectively, and the active area interconnection layer 370.

FIG. 4 shows that some of the interconnection layers may lie directly under other layers, including those that form digit lines. As shown in the cross-sectional views in FIGS. 5 through 8, an interconnection layer may underlie another layer as long as there is an insulating layer separating the layers. For example, the active area interconnection layer (e.g. 370 in FIGS. 6 and 8) may lie directly under the digit lines formed in the buried polycide interconnection layer (e.g. $D_{5L}$ in FIG. 6 and $D_{11L}$ in FIG. 8) since an insulating layer 510 separates the interconnection layers. The active area interconnection layer (e.g. 370 in FIGS. 6 and 8) may also lie directly under interconnection layers formed in the metallization layer (e.g. $D_{5R}$ in FIG. 6 and $D_{11L}*$ in FIG. 8) since the interconnection layers are separated by the combination of insulating layers 510 and 520. Interconnections formed in the buried polycide layer (e.g. $D_{5L}$ in FIG. 6 and $D_{11L}$ in FIG. 8) may in turn lie directly under interconnections formed in the metallization layer (e.g. $D_{5L}*$ in FIG. 6 and $D_{11L}*$ in FIG. 8) since those interconnection levels are separated by insulating layer 520. The only exception is that interconnections formed in the polysilicon layer (e.g. 350 in FIG. 6) may not overlie the interconnections formed in the active area (e.g. 370 in FIG. 6) because the active area is implanted into the substrate 500 after the polysilicon layer has been deposited. Insulating layers 510 and 520 may be formed of silicon oxide or the like, and each layer may be formed in one or more processing steps.

FIG. 5 is a schematic cross-sectional view taken along the line V—V in FIG. 4. This line traverses the top row in an interconnection array subunit 300. FIG. 5 shows that the interconnection 370 in the active area may be formed in a diffused region in a semiconductor substrate 500, such as a P-well, with the substrate 500 doped so as to have a P-type conductivity, for example. The interconnection 370 in the active area may then be doped so as to have an $N^+$-type conductivity. The substrate 500 may have an upper surface 530. An insulating layer 510 insulates the interconnection 370 in the active area from the buried digit lines. The insulating layer 510 also insulates the dummy word lines 320 from the true digit line $D_{1L}$ and the associated complementary digit line $D_{1R}*$, which are both formed in the burned layer of polycide. An insulating layer 520 insulates the true digit line $D_{1L}$ and the associated complementary digit line $D_{1R}*$, which are both formed in the buried layer of polycide, from the associated complementary digit line $D_{1L}*$ and the true digit line $D_{1R}$, which are both formed in the layer of metallization. The associated complementary digit line $D_{1L}*$ connects to the respective associated complementary digit line $D_{1R}*$ through the contact 340, which contacts the buried polycide layer forming $D_{1R}*$ within the surround 440. A suitable plug, such as a tungsten plug, may be used to form contact 340.

Turning now to FIG. 6, a schematic cross-sectional view taken along the line VI—VI in FIG. 4. This line traverses the path of a true odd digit line, including portions $D_{2j+1L}$ and $D_{2j+1R}$ (j=0, 1, 2, 3, 4, 5). This path crosses three sections of active area interconnection 370. The middle section of active area interconnection 370 in FIG. 6 is the interconnection 370 formed in the active area between the digit line pairs ($D_6$, $D_6*$) and ($D_7$, $D_7*$), and which connects $D_{6L}$ to $D_{6R}*$. The side sections of the interconnection 370, on either side of the middle section of the interconnection 370, are formed in the active area between the digit line pairs ($D_4$, $D_4*$) and ($D_5$, $D_5*$), and connect $D_{4L}$ to $D_{4R}*$. Two sections of polysilicon interconnection 350 are shown in FIG. 6. Both sections are formed in the polysilicon layer between the digit line pairs. ($D_5$, $D_5*$) and ($D_6$, $D_6*$) that connects $D_{6L}*$ to $D_{6R}*$. As can be seen in FIG. 6, active area 370 is insulated from other interconnects.

The insulating layer 510 also insulates the dummy word lines 320 and the interconnection 350 from the true digit line $D_{5L}$ and the associated complementary digit line $D_{5R}*$, both formed in the buried layer of polycide. The insulating layer 520 insulates the true digit line $D_{5L}$ and the associated complementary digit line $D_{5R}*$, both formed in the buried layer of polycide, from the associated complementary digit line $D_{5L}*$ and the true digit line $D_{5R}$, both formed in the layer of metallization. The true digit line $D_{5L}$ connects to the respective true digit line $D_{5R}$ through the contact hole 330, which is surrounded by the surround 430. A suitable plug, such as an aluminum plug or a tungsten plug, may be used to fill the contact hole 330.

FIG. 7 shows a schematic cross-sectional view taken along the line VII—VII in FIG. 4. This line traverses the path of an associated complementary even digit line, including portions $D_{2jL}^*$ and $D_{2jR}^*$ (j=1, 2, 3, 4, 5). The path crosses a section of true odd digit line ($D_{7L}$) with surround 430, a section of associated complementary odd digit line ($D_{7L}^*$) with surround 440, and a section of true odd digit line ($D_{7R}$), all of which are insulated from each other by the insulating layer 520. The insulating layer 510 insulates the interconnection 350 from the true even digit lines $D_{8L}$ and $D_{8R}$, which are both formed in the buried layer of polycide. The insulating layer 520, in turn, insulates the true even digit lines $D_{8L}$ and $D_{8R}$, which are both formed in the buried layer of polycide, from the associated complementary digit lines $D_{8L}^*$ and $D_{8R}^*$, both formed in the layer of metallization. The associated complementary even digit line $D_{8L}^*$ connects to the interconnection 350 formed in the polysilicon layer through the contact hole 355, which is surrounded by the surround 455.

The polysilicon interconnection layer 350 connects, in turn, to the corresponding associated complementary digit line $D_{8R}^*$ through the contact hole 360, which is surrounded by the surround 460. A suitable plug, such as an aluminum or a tungsten plug, may be used to fill the contact holes 355 and 360. Also shown in FIG. 7 is a section of the contact hole 375, filled with a polysilicon plug 700, and a section of the contact hole 380, filled with a polysilicon plug 710. As shown in FIGS. 7 and 8, the polysilicon plugs 700 and 710 connect the true digit lines (e.g. $D_{8L}$ and $D_{8R}$) to the upper surface 530 of the substrate 500.

FIG. 8 shows a schematic cross-sectional view taken along the line VIII—VIII in FIG. 4. This line traverses the path taken by a true even bit line. The path crosses sections of digit line pairs ($D_{11}$, $D_{11}^*$), a section of digit line $D_{9L}$ with surround 430, and a section of associated complementary digit line $D_{11R}^*$ with surround 440, all insulated from each other by the insulating layer 520, and all insulated from the interconnection 370 in the active area by the insulating layer 510. The insulating layer 520, in turn, insulates the true digit lines $D_{10L}$ and $D_{10R}$, both formed in the buried layer of polycide, from the associated complementary digit lines $D_{10L}^*$ and $D_{10R}^*$, both formed in the layer of metallization. The true digit line $D_{10L}$ connects to the interconnection 370 formed in the active area through the contact hole 375. The interconnection 370 formed in the active area connects, in turn, to the respective true digit line $D_{10R}$ through contact 380. Contacts 375 and 380 may be filled with the polysilicon plugs 700 and 710, respectively, as shown in FIGS. 7 and 8.

The fabrication of embodiments of the present invention involve a number of process steps. These steps are typically inherent to a DRAM process and no special steps are required except in some cases. A first step includes forming a p-well in a semiconductor substrate such as a silicon substrate, which will hold the DRAM array. A second step includes forming active areas and field isolation regions. A third step includes forming n-well regions in which the p-channel devices will be formed. A fourth step includes forming a first insulating layer on the active areas to act as gate oxide layers for transfer transistors. A fifth step includes forming and patterning a polysilicon/tungsten silicide/cap oxide stack (also referred to as polysilicon or poly) on the first insulating layer to act as gate electrodes for the transfer transistors, word lines and also form interconnections 350 in the vertical twisting region 310.

Next, sidewall spacers are formed on the polysilicon gates, and the n-channel and p-channel transistors are formed by masking and implantation according to the CMOS process employed. A barrier oxide layer (300 A or so) is then deposited followed by Borophosphsilicate glass (BPSG) deposition. This is planarized, using, for example, chemical-mechanical polishing (CMP) techniques known to those of ordinary skill in the art to provide a planarized surface for subsequent processing. Contact holes are then formed in the BPSG layers, these holes then being filled with conductive plugs of, for example, heavily n-type polysilicon. These plugs are used in the array to contact the cell capacitors and in the twist region to form contacts between the buried digit line and active area. They could also be employed to contact the n-channel transistors in the periphery.

The next step involves deposition of a thin (e.g., 500 Å) oxide (TEOS) layer, and patterning that layer using conventional mask techniques to open up holes therein through to the plugs desired to be contacted, including those in the twist where a contact between the buried digit line and active area needs to be formed.

Another polysilicon/tungsten silicide/cap oxide stack is deposited and patterned to form the buried digit lines. After this is accomplished, the DRAM capacitors are formed on top of the digit lines, in a conventional manner.

After capacitor formation, another layer of BPSG is deposited and planarized as previously described. The BPSG layer is then patterned to form contacts to active areas, polysilicon plugs or buried digit lines below, including contacts in the twist region where the buried digit line is to be twisted up to metal 1 and metal 1 twisted down to buried digit line. The contacts are then filled with plugs of, for example, tungsten after a barrier layer such as TiN has been deposited. Chemical Vapor Deposition (CVD) is typically used for these steps. Next the metal 1 is formed and patterned. The metal 1 in a typical embodiment comprises a 300 A Ti/3 kA AlCu/300 A TiN stack. It is used to form interconnects for the circuits, route power supplies and form the complementary digit lines. At this point, the processing completes the formation of the vertical twist. The remaining steps such as metal 2, passivation etc. in the DRAM processing can be carried out using steps inherent to the DRAM process.

The foregoing is not necessarily an exhaustive outline of the processing steps that may be required to fabricate a memory IC in accordance with an embodiment of this invention. In other words, one skilled in the art having the benefit of the present disclosure would recognize that other processing steps may precede, follow, or be interspersed with the those outlined above.

The vertical twist scheme, as described in the embodiment shown in FIGS. 3–8, enables a $6F^2$ cross-point architecture for a high-density DRAM memory array to be realized. The true and associated complementary digit line pairs in such a DRAM memory array are formed in a buried polycide and an overlying metal layer. The twist is achieved vertically between the polycide layer and the metal layer for every twisted digit line pair without using an additional underlying interconnection layer and while maintaining the column pitch restraints. The column pitch restraints are maintained by having the adjacent untwisted digit line pair routed under the vertical twist of the twisted digit line pair by using the underlying active area and an underlying polysilicon layer as interconnection layers for the adjacent untwisted digit line pair. In this embodiment, not every digit line pair is twisted in each vertical twisting region. Each twisted digit line pair is adjacent to an untwisted digit line pair. Further, in this embodiment, adjacent digit line pairs are not transposed across each vertical twisting region.

The vertical twist scheme, as described in the embodiment shown in FIGS. 3–8, does not rely on using cell polysilicon, used in memory cell capacitors, as an interconnection layer for the adjacent untwisted digit line pair, using instead the underlying active area and the underlying polysilicon layer, used also for the gate polysilicon, as interconnection layers for the adjacent untwisted digit line pair, thereby improving the manufacturing yield for such a vertical twist. The interconnection formed in the underlying polysilicon layer that is also used for the gate polysilicon has a lower sheet resistance (also known as sheet resistivity) than the cell polysilicon used in memory cell capacitors, and the gate polysilicon layer is a much better layer to connect to through a contact hole. The gate polysilicon layer may be polycided and may have a sheet resistance of about 7–8 ohms per square ($\Omega/\square$). The polysilicon layer may be doped, for example, with phosphorus, to render it electrically conductive, and then the polyciding may be accomplished by depositing either a refractory metal silicide layer directly on the polysilicon layer. Those of ordinary skill in the art will appreciate that the polycided gate can be replaced with a refractory metal gate or refractory metal/polysilcon gate stack. Aluminum or aluminum alloy may be used for the layer of metallization. One of ordinary skill in the integrated circuit fabrication art would recognize that an N-well in a semiconductor substrate such as a silicon substrate may be used instead of the P-well, and that P$^+$-type diffusion regions may be used for the active areas instead of the N$^+$-type diffusion regions.

Although the concepts of the present invention are presented principally herein in connection with semiconductor memory arrays, they are equally applicable to any IC device employing paired line conductors extending substantially parallel to each other. One of ordinary skill in the relevant arts would recognize that the vertical twist scheme, as described in the embodiment shown in FIGS. 3–8, would also be applicable to any interconnection array having paired true/associated complementary line conductors, such as integrated circuit address/data busses.

The vertical twist scheme, as described in the embodiment shown in FIGS. 3–8, also enables more control over the sheet resistances of the interconnections formed in the underlying gate polysilicon layer and of the interconnections formed in the underlying active areas. The N$^+$-type diffusion regions for the active areas may have a sheet resistance of about 100 $\Omega/\square$, and any mismatch between the sheet resistances of the interconnections formed in the gate polysilicon layer and the interconnections formed in the active areas may be reduced by widening the active area. Those of ordinary skill in the art having the benefit of the present disclosure will appreciate that it may be possible to choose diffusions or interconnect layers other than as disclosed herein in the practice of the present invention. For example, in the disclosed embodiment, the active area can be replaced with a polysilicon plug, with no penalty.

Although a specific embodiment of the invention has been disclosed herein in some detail, it is to be understood that this has been done solely for the purposes of illustrating various features and aspects of the present invention, and is not intended to be limiting with respect to the scope of the invention as defined in the appended claims. It is contemplated that those of ordinary skill in the art having the benefit of this disclosure will be able to make various substitutions, alterations and/or modifications to the disclosed embodiment, including but not limited to those implementation-specific alternatives which may have been specifically noted in this disclosure, without departing from the spirit and scope of the invention.

What is claimed is:

1. An interconnection array subunit, comprising:
    a first pair of line conductors in first and second regions, said first pair of line conductors including a first true line conductor and a first associated complementary line conductor connected and vertically twisted in a vertical twisting region between said first and second regions;
    a second pair of line conductors adjacent to said first pair of line conductors in said first and second regions, said second pair of line conductors including a second true line conductor and a second associated complementary line conductor;
    a first interconnection layer disposed in said vertical twisting region, said first interconnection layer connecting said second associated complementary line conductor in said first region to said second associated complementary line conductor in said second region; and
    a second interconnection layer disposed in said vertical twisting region, said second interconnection layer connecting said second true line conductor in said first region to said second true line conductor in said second region;
    wherein said first true line conductor is disposed below said first associated complementary line conductor in said first region and above said first associated complementary line conductor in said second region, and said second true line conductor is disposed below said second associated complementary line conductor in said first and second regions,
    wherein said first interconnection layer and said second interconnection layer are disposed below said first of line conductors in said vertical twisting region.

2. The interconnection array subunit of claim 1, wherein said first interconnection layer is non-overlapping with said second interconnection layer.

3. The interconnection array subunit of claim 2, wherein a portion of said first and second true line conductors comprises polycide.

4. The interconnection array subunit of claim 2, wherein a portion of said first and second associated complementary line conductors comprises metal.

5. The interconnection array subunit of claim 2, wherein said first interconnection layer comprises polysilicon.

6. The interconnection array subunit of claim 2, wherein said second interconnection layer comprises active areas.

7. The interconnection array subunit of claim 2, wherein a first pitch between said first pair of line conductors and said second pair of line conductors in said first region is substantially similar to a second pitch between said first pair of line conductors and said second pair of line conductors in said second region.

8. The interconnection array subunit of claim 2, wherein:
    said first interconnection layer connects to said second associated complementary line conductor through first and second contact holes disposed substantially at respective first and second peripheral portions of said first interconnection layer in said vertical twisting region;
    said first true line conductor in said first region connects to said first true line conductor in said second region through a third contact hole in said vertical twisting region;

and said first associated complementary line conductor in said first region connects to said first associated complementary line conductor in said second region through a fourth contact hole in said vertical twisting region.

9. The interconnection array subunit of claim 2, wherein said second interconnection layer connects to said second true line conductor through first and second overlapping interconnects disposed substantially at respective first and second peripheral portions of said second interconnection layer in said vertical twisting region.

10. The interconnection array subunit of claim 1, wherein:
said first and second associated complementary line conductors include metal;
said first interconnection layer includes polysilicon, and said second interconnection layer includes active areas;
a first pitch between said first pair of line conductors and said second pair of line conductors in said first region is substantially the same as a second pitch between said first pair of line conductors and said second pair of line conductors in said second region;
said first interconnection layer connects to said second associated complementary line conductor through first and second contact holes disposed substantially at respective first and second peripheral portions of said first interconnection layer in said vertical twisting region;
said first true line conductor in said first region connects to said first true line conductor in said second region through a third contact hole in said vertical twisting region;
said first associated complementary line conductor in said first region connects to said first associated complementary line conductor in said second region through a fourth contact hole in said vertical twisting region;
and said second interconnection layer connects to said second true line conductor through first and second overlapping interconnects disposed substantially at respective first and second peripheral portions of said second interconnection layer in said vertical twisting region.

11. An interconnection array comprising:
a plurality of first paired line conductors, each pair of first paired line conductors including a first true line conductor and a first associated complementary line conductor, said plurality of first paired line conductors being substantially parallel within a first region and within a second region, each of said first true line is conductors being disposed below each of said first associated complementary line conductors in said first region and each of said first true line conductors being disposed above each of said first associated complementary line conductors in said second region;
a plurality of second paired line conductors, each pair of second paired line conductors including a second true line conductor and a second associated complementary line conductor, said plurality of second paired line conductors being substantially parallel within said first region and within said second region, each of said second true line conductors being disposed below each of said second associated complementary line conductors in said first region and in said second region, said plurality of second paired line conductors alternating with said plurality of first paired line conductors so that each pair of said plurality of first paired line conductors is adjacent to a corresponding pair of said plurality of second paired line conductors;

a plurality of first interconnection layers disposed in a vertical twisting region between said first region and said second region, each of said first interconnection layers connecting a respective second associated complementary line conductor of said plurality of second paired line conductors in said first region to a corresponding second associated complementary line conductor of said plurality of second paired line conductors in said second region, said plurality of first interconnection layers being disposed below first portions of said plurality of first paired line conductors in said vertical twisting region; and a plurality of second interconnection layers disposed in said vertical twisting region, each of said second interconnection layers connecting a respective second true line conductor of said plurality of second paired line conductors in said first region to a corresponding second true line conductor of said plurality of second paired line conductors in said second region, said plurality of second interconnection layers alternating with said plurality of first interconnection layers such that each of said first interconnection layers of said plurality of first interconnection layers is non-overlapping with a corresponding second interconnection layer of said plurality of second interconnection layers, said plurality of second interconnection layers being disposed below second portions of said plurality of first paired line conductors in said vertical twisting region;

wherein each of said first true line conductors of said plurality of first paired line conductors in said first region is connected in said vertical twisting region to a respective first true line conductor of said plurality of first paired line conductors in said second region;

and wherein each of said first associated complementary line conductors of said plurality of first paired line conductors in said first region is connected in said vertical twisting region to a respective first associated complementary line conductor of said plurality of first paired line conductors in said second region.

12. The interconnection array of claim 11, wherein said first and second true line conductors include polycide.

13. The interconnection array of claim 12, wherein:
said first and second associated complementary line conductors include metal;
said first interconnection layers include polysilicon, and said second interconnection layers including active areas;
a first pitch between successive first paired line conductors and second paired line conductors in said first region is substantially similar to a second pitch between successive first paired line conductors and second paired line conductors in said second region;
each of said first interconnection layers connects to said respective and corresponding second associated complementary line conductors through respective first and second contact holes disposed substantially at respective first and second peripheral portions of each of said first interconnection layers in said vertical twisting region;
each of said first true line conductors of said plurality of first paired line conductors in said first region connects to said respective first true line conductor of said plurality of first paired line conductors in said second region through a third contact hole in said vertical twisting region;

each of said first associated complementary line conductors of said plurality of first paired line conductors in said first region connects to said respective first associated complementary line conductor of said plurality of first paired line conductors in said second region through a fourth contact hole in said vertical twisting region;

and each of said second interconnection layers connects to said respective and corresponding second true line conductors through respective first and second overlapping interconnects disposed substantially at respective first and second peripheral portions of each of said second interconnection layers in said vertical twisting region.

14. The interconnection array of claim 11, wherein said first and second associated complementary line conductors include metal.

15. The interconnection array of claim 11, wherein said first interconnection layers include polysilicon.

16. The interconnection array of claim 11, wherein said second interconnection layers include active areas.

17. The interconnection array of claim 11, wherein a first pitch between successive first paired line conductors and second paired line conductors in said first region is the same as a second pitch between successive first paired line conductors and second paired line conductors in said second region.

18. The interconnection array of claim 11, wherein:

each of said first interconnection layers connects to said respective and corresponding second associated complementary line conductors through respective first and second contact holes disposed substantially at respective first and second peripheral portions of each of said first interconnection layers in said vertical twisting region;

each of said first true line conductors of said plurality of first paired line conductors in said first region connects to said respective first true line conductor of said plurality of first paired line conductors in said second region through a third contact hole in said vertical twisting region;

and each of said first associated complementary line conductors of said plurality of first paired line conductors in said first region connects to said respective first associated complementary line conductor of said plurality of first paired line conductors in said second region through a fourth contact hole in said vertical twisting region.

19. The interconnection array of claim 11, wherein each of said second interconnection layers connects to said respective and corresponding second true line conductors through respective first and second overlapping interconnects disposed substantially at respective first and second peripheral portions of each of said second interconnection layers in said vertical twisting region.

20. An interconnection array formed in vertically-stacked layers on an integrated circuit, comprising:

a first twisting region;

a first pair of true and complementary conductive paths spanning from a left side of the first twisting region to a right side of the first twisting region; and a second pair of ture and complementary conductive paths spanning from a left side of the first twisting region to a right side of the first twisting region;

wherein the first twisting region affects a vertical twist in the first pair of conductive paths between the left side to the right side, wherein the first twisting region does not affect a horizontal twist of the second pair of conductive paths between the left side to the right side, and wherein the first twisting region does not affect a vertical twist in the second pair of conductive paths between the left side to the right side, although the first twisting region routes both of the conductive paths of the second pair to different layers in the integrated circuit using contacts or visa.

21. The interconnection array of claim 20, wherein the first twisting region affects a vertical twist in the first pair of conductive paths by routing the conductive paths to different layers in the integrated circuit using contacts or vias.

22. The interconnection array of claim 20, wherein the true and complementary conductive paths of the first pair are vertically spaced from each other on the right and left sides, and wherein the true and complementary conductive paths of the second pair are vetically spaced from each other on the right and left sides.

23. The interconnection array of claim 20, wherein the first pair of conductive paths is horizontally adjacent the second pair of conductive paths.

24. The interconnection array of claim 20, further comprising:

a second twisting region, wherein the second twisting region is horizontally displaced from the first twisting region along an axis generally parallel to an axis of the conductive path pairs;

wherein the second twisting region affects a vertical twist in the second pair of conductive paths between the left side to the right side, wherein the second twisting region does not affect a horizontal twist of the first pair of conductive paths between the left side to the right side, and wherein the second paths between the left side to the right side, although the second twisting region routes both of the conductive paths of the first pair to different layers in the integrated circuit using contacts or vias.

25. An interconnection array formed in vertically-stacked layers on an integrated circuit, comprising:

a first twisting region having left and right sides afjacent thereto;

a first pair of true and complementary conductive paths present in the first twisting region, in the left side, and in the right side; and a second pair of true and complementary conductive paths present in the first twisting region, in the left side, and in the righ side;

wherein the first twisting region affects a vertical twist in the first pair of conductive paths between the left side to the right side, wherein the first twisting region does not affect a horizontal twist of the second pair of conductive paths between the left side to the right side, and wherein the first twisting region does not affect a vetical twist in the second pair of conductive paths between the left side to the right side, although the first twisting region routes both of the conductive paths of the second pair to different layers in the integrated circuit using contacts or vias.

26. The interconnection array of claim 25, wherein the first pair of conductive paths are formed along an first axis in the left side and in the right side, and wherein the second pair of conductive paths are formed along a second axis in the left side and in the right side.

27. The interconnection array of claim 26, wherein the first pair of conductive paths is horizontally adjacent the second pair of conductive paths.

28. The interconnection array of claim 26, further comprising:

a second twisting region having left and right side adjacent thereto, wherein the second twisting region is horizontally displaced along an axis generally parallel to the first or second axes;

wherein the second twisting region affects a vertical twist in the second pair of conductive paths between the left side to the right side, and wherein the second twisting region does not affect a horizontal twist of the first pair of conductive paths between the left side to the right side, and wherein the second twisting region does not affect a vertical twist in the first pair of conductive paths between the left side to the right side, although the second twisting region routes both of the conductive paths of the first pair to different layers in the integrated circuit using contacts or vias.

29. The interconnection array of claim 26, wherein the first twisting region affects a vertical twist in the first pair of conductive paths by routing the conductive paths to different layers in the integrated circuit using contacts or vias.

30. The interconnection array of claim 26, wherein the true and complementary conductive paths of the first pair are vetically spaced of the second pair are vertically spaced from each other on the right and left sides.

* * * * *

UNITED STATES PATENT AND TRADEMARK OFFICE
CERTIFICATE OF CORRECTION

PATENT NO. : 7,259,464 B1
APPLICATION NO. : 09/567673
DATED : August 21, 2007
INVENTOR(S) : Batra It is certified that error appears in the above-identified patent and that said Letters Patent is hereby corrected as shown below:

In column 14, line 12 (Approx.), in Claim 1, after "conductors" insert -- directly --.

In column 14, line 27 (Approx.), in Claim 1, delete "region;" and insert -- region, --, therefor.

In column 14, line 36, in Claim 1, after "first" insert -- pair --.

In column 14, line 62, in Claim 8, before "vertical" delete "first interconnection layer in said".

In column 15, line 26 (Approx.), in Claim 10, before "vertical" delete "first interconnection layer in said".

In column 15, line 48, in Claim 11, after "line" delete "is".

In column 15, line 66, in Claim 11, after "is" insert -- directly --.

In column 16, line 29, in Claim 11, delete "region;" and insert -- region, --, therefor.

In column 16, lines 59-60, in Claim 13, after "portions of" delete "each of said first interconnection layers in".

In column 17, lines 33-34 (Approx.), in Claim 18, after "portions of" delete "each of said first interconnection layers in".

In column 17, line 62, in Claim 20, delete "ture" and insert -- true --, therefor.

In column 18, line 9, in Claim 20, delete "visa." and insert -- vias. --, therefor.

In column 18, line 18, in Claim 22, delete "vetically" and insert -- vertically --, therefor.

In column 18, line 36, in Claim 24, after "second" insert -- twisting region does not affect a vertical twist in the first pair of conductive --.

In column 18, line 42, in Claim 25, delete "afjacent" and insert -- adjacent --, therefor.

In column 18, line 50 (Approx.), in Claim 25, delete "righ" and insert -- right --, therefor.

In column 18, line 57, in Claim 25, delete "vetical" and insert -- vertical --, therefor.

UNITED STATES PATENT AND TRADEMARK OFFICE
CERTIFICATE OF CORRECTION

PATENT NO. : 7,259,464 B1
APPLICATION NO. : 09/567673
DATED : August 21, 2007
INVENTOR(S) : Batra It is certified that error appears in the above-identified patent and that said Letters Patent is hereby corrected as shown below:

In column 19, line 6, in Claim 28, delete "side" and insert -- sides --, therefor.

In column 20, line 13, in Claim 30, delete "vetically" and insert -- vertically --, therefor.

In column 20, line 13, in Claim 30, before "of the" insert -- from each other on the right and left sides, and wherein the true and complementary conductive paths --.

Signed and Sealed this

Sixth Day of November, 2007

JON W. DUDAS
*Director of the United States Patent and Trademark Office*

UNITED STATES PATENT AND TRADEMARK OFFICE
CERTIFICATE OF CORRECTION

PATENT NO.      : 7,259,464 B1
APPLICATION NO. : 09/567673
DATED           : August 21, 2007
INVENTOR(S)     : Batra It is certified that error appears in the above-identified patent and that said Letters Patent is hereby corrected as shown below:

In column 14, line 12 (Approx.), in Claim 1, after "conductors" insert -- directly --.

In column 14, line 27 (Approx.), in Claim 1, delete "region;" and insert -- region, --, therefor.

In column 14, line 36, in Claim 1, after "first" insert -- pair --.

In column 14, line 62, in Claim 8, before "vertical" delete "first interconnection layer in said".

In column 15, line 26 (Approx.), in Claim 10, before "vertical" delete "first interconnection layer in said".

In column 15, line 48, in Claim 11, after "line" delete "is".

In column 15, line 66, in Claim 11, after "is" insert -- directly --.

In column 16, line 29, in Claim 11, delete "region;" and insert -- region, --, therefor.

In column 16, lines 59-60, in Claim 13, after "portions of" delete "each of said first interconnection layers in".

In column 17, lines 33-34 (Approx.), in Claim 18, after "portions of" delete "each of said first interconnection layers in".

In column 17, line 62, in Claim 20, delete "ture" and insert -- true --, therefor.

In column 18, line 9, in Claim 20, delete "visa." and insert -- vias. --, therefor.

In column 18, line 18, in Claim 22, delete "vetically" and insert -- vertically --, therefor.

In column 18, line 36, in Claim 24, after "second" insert -- twisting region does not affect a vertical twist in the first pair of conductive --.

In column 18, line 42, in Claim 25, delete "afjacent" and insert -- adjacent --, therefor.

In column 18, line 50 (Approx.), in Claim 25, delete "righ" and insert -- right --, therefor.

In column 18, line 57, in Claim 25, delete "vetical" and insert -- vertical --, therefor.

UNITED STATES PATENT AND TRADEMARK OFFICE
CERTIFICATE OF CORRECTION

PATENT NO. : 7,259,464 B1
APPLICATION NO. : 09/567673
DATED : August 21, 2007
INVENTOR(S) : Batra It is certified that error appears in the above-identified patent and that said Letters Patent is hereby corrected as shown below:

In column 19, line 6, in Claim 28, delete "side" and insert -- sides --, therefor.

In column 20, line 13, in Claim 30, delete "vetically" and insert -- vertically --, therefor.

In column 20, line 13, in Claim 30, before "of the" insert -- from each other on the right and left sides, and wherein the true and complementary conductive paths --.

Signed and Sealed this

Thirteenth Day of November, 2007

JON W. DUDAS
*Director of the United States Patent and Trademark Office*